United States Patent [19]
Shi et al.

[11] Patent Number: 5,504,183
[45] Date of Patent: Apr. 2, 1996

[54] ORGANOMETALLIC FLUORESCENT COMPLEX POLYMERS FOR LIGHT EMITTING APPLICATIONS

[75] Inventors: Song Q. Shi, Phoenix; Franky So, Tempe, both of Ariz.

[73] Assignee: Motorola, Schaumburg, Ill.

[21] Appl. No.: 304,453

[22] Filed: Sep. 12, 1994

[51] Int. Cl.$^6$ .................................................. C08G 63/02
[52] U.S. Cl. ........................ 528/272; 528/395; 528/298; 252/500; 252/506
[58] Field of Search ..................... 528/272, 395, 528/298; 252/500, 506

[56] References Cited

U.S. PATENT DOCUMENTS 4,719,286   1/1988   Matlow ................................... 528/362

FOREIGN PATENT DOCUMENTS 3-002209   8/1991   Japan .

*Primary Examiner*—James J. Seidleck
*Assistant Examiner*—Richard Jones
*Attorney, Agent, or Firm*—Eugene A. Parsons

[57] ABSTRACT

A fluorescent complex polymer with fluorescent organometallic complexes connected by organic chain spacers is utilized in the fabrication of light emitting devices on a substantially transparent planar substrate by depositing a first conductive layer having p-type conductivity on the planar surface of the substrate, depositing a layer of a hole transporting and electron blocking material on the first conductive layer, depositing a layer of the fluorescent complex polymer on the layer of hole transporting and electron blocking material as an electron transporting emissive layer and depositing a second conductive layer having n-type conductivity on the layer of fluorescent complex polymer.

11 Claims, 1 Drawing Sheet

ORGANOMETALLIC FLUORESCENT COMPLEX POLYMERS FOR LIGHT EMITTING APPLICATIONS

The U.S. Government has rights in this invention, pursuant to Cooperative Research and Development Agreement No. SC93/01171 between Sandia Corporation and Motorola, Inc.

FIELD OF THE INVENTION

The present invention relates to fluorescent polymers for use in devices such as light emitting diodes.

BACKGROUND OF THE INVENTION

Small organic dye molecules, especially small organometallic complexes, are well known for their high fluorescent efficiencies in electroluminescence (EL) devices. For example tris(8-quinolinolate)aluminum complex (Alq) is one of the most efficient small molecular organic electroluminescent materials. Compared to inorganic direct band gap semiconductor (such as GaAs) devices, the cost to fabricate those small molecule organic semiconductor devices for commercial use is low. However the fabrication cost is still too high when compared to polymer semiconductor devices, since polymer film can be fabricated by simple spin-coating, or printing instead of thermal evaporation as in the case of small organic molecules. More importantly, polymer processing is suitable for large-area light-emitting displays which are more difficult to process using small organic molecules. Furthermore, polymers do not suffer from the problem of aggregation or recrystallization as small organic molecules do, which has been one of the major recognized hurdles for the long term reliability of small organic molecule semiconductor devices.

To lower the manufacturing cost and yet keep the large-area display capability of a polymer system, molecularly doped polymers have been studied for light emitting devices (LEDs) by Japanese scientists. Kido and coworkers (J. Kido, et. al., *Jpn. J. Appl. Phys.*, 31, L961 (1992)) have used triphenyldiamine derivative (TPD)- doped poly(methyl methacrylate) and polycarbonate as hole transport layers in organic electroluminescent devices. He has achieved white light-emission from three fluorescent dye-doped poly(vinylcarbazole) in a single Light-emitting diode (LED) device (J. Kido, et. al., *Appl. Phys. Lett.*, 64(7), 815 (1994)). In one instance, he fabricated a LED with Alq and TPD doped PMMA and obtained green emission of luminance 920 cd/m$^2$ at 17 V (J. Kido, et. al. *Appl. Phys. Lett.*, 61(7), 761 (1992)). Though molecularly doped polymer devices can be fabricated inexpensively and applicable to large-area LED display, they have also been plagued with the stability problems caused by the phase-separation of small molecular dopants from the polymer matrix due to the incompatibilities of small molecular dopants with the polymers.

Fluorescent organometallic complexes stand out from the rest of small organic fluorescent dyes for their semi-conductivity, thermal stability and high EL efficiency in LED applications.

It is a purpose of this invention to provide a class of new materials for use in light emitting devices that combines the high EL efficiency of small organometallic complexes with the easy processability of polymers.

It is another purpose of this invention to provide a class of new materials for use in light emitting devices with improved reliability.

It is still another purpose of this invention to provide a class of new materials for use in light emitting devices for large-area display applications.

It is yet another purpose of this invention to provide a class of new materials for use in light emitting devices which is relatively easy and inexpensive to manufacture.

SUMMARY OF THE INVENTION

The above described problems and others are at least partially solved and the above purposes are realized by a method for the preparation of a fluorescent complex polymer including the step of connecting fluorescent organometallic complexes by organic chain spacers.

The above described problems and others are at least partially solved and the above purposes are realized by a method of fabricating light emitting devices on a substantially transparent planar substrate including depositing a first conductive layer having p-type conductivity on the planar surface of the substrate, depositing a layer of a hole transporting and electron blocking material on the first conductive layer, depositing a layer of the fluorescent complex polymer on the layer of hole transporting and electron blocking material as an electron transporting emissive layer, and depositing a second conductive layer having n-type conductivity on the layer of fluorescent complex polymer

BRIEF DESCRIPTION OF THE DRAWINGS

Referring to the drawings.

DESCRIPTION OF THE PREFERRED EMBODIMENTS

Figure 1:
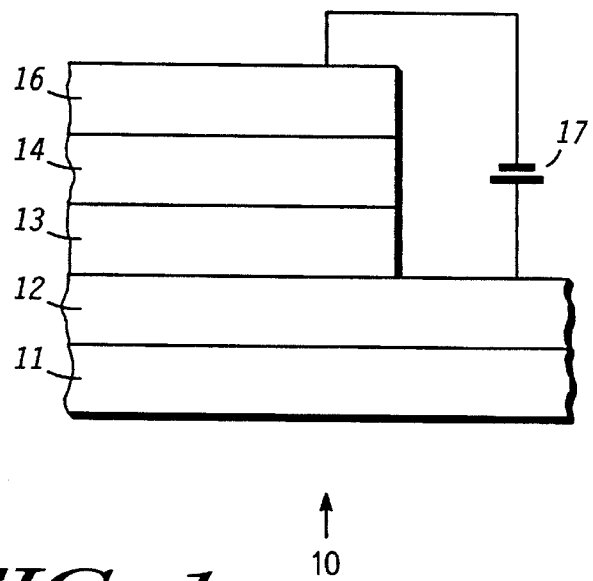
FIG. 1 is a simplified sectional view of a light emitting device structure incorporating the present invention.

A light emitting device (LED) 10 is illustrated in a simplified cross-sectional view in FIG. 1. Generally, LED 10 includes a substrate 11 which in this specific embodiment is a glass plate having a relatively planar upper surface. An electrically conductive layer 12 is deposited on the planar surface of substrate 11 so as to form a relatively uniform electrical contact. A first polymer layer 13 made of a hole transporting polymer is deposited on conductive layer 12. In general, it is also desirable for first polymer layer 13 to be an electron blocking, or low electron conductivity, material. A second polymer layer 14, including one of the fluorescent complex polymers disclosed in detail below, is deposited onto first polymer layer 13. Second polymer layer 14 is generally an electron transporting material and also operates as an emissive layer. Then a second electrically conductive layer 16 is deposited on the upper surface of second polymer layer 14 to form a second electrical contact.

While it should be understood that light generated within second polymer layer 14 can be emitted either through layers 13, 12 and substrate 11 or, alternatively, through layer 16, in the present embodiment conductive layer 12 is formed of organic or inorganic conductors, such as conductive polyaniline (PANI) or indium-tin-oxide (ITO), which are substantially transparent to visible light so that the emitted light exits downwardly through substrate 11 in FIG. 1.

Also, in FIG. 1 LED 10 has a potential applied between layers 12 and 16 by means of a potential source 17. In this embodiment conductive layer 12 is a p-type contact and conductive layer 16 is an n-type contact. A negative terminal of potential source 17 is connected to conductive layer 16 and a positive terminal is connected to conductive layer 12. Electrons are injected from the n-type contact (conductive layer 16) into the fluorescent complex polymer (second polymer layer 14) and holes injected from the p-type contact (first conductive layer 12) are transported through first polymer layer 13 and into the fluorescent complex polymer layer (second polymer layer 14) where, upon an electron and a hole recombination, a photon is emitted. First polymer layer 13, made of any hole transporting polymers such as poly(phenylene vinylene), poly(aromatic amine), etc., is used to transport holes into second polymer layer 14. While second polymer layer 14 serves as an electron transporting layer, it also serves as a light emitter.

It should be emphasized that the active layers, first polymer layer 13 (hole transporting layer) and second polymer layer 14 (emissive and electron transporting layer) in FIG. 1, are formed of polymers so that LED 10 can be manufactured inexpensively and have all the other advantage of polymer semiconductor devices.

Figure 2:
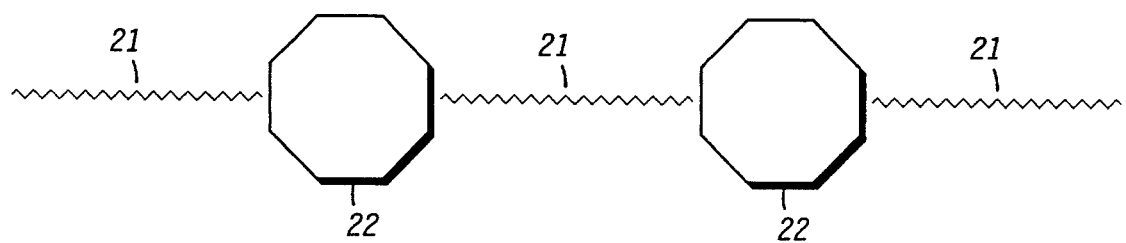
FIG. 2 is a schematic representation of an organometallic fluorescent complex polymer in accordance with the present invention.

The present invention includes a new class of fluorescent complex polymers for use in light emitting devices as emissive materials, such as, for example, second polymer layer 14 in FIG. 1. This class of fluorescent complex polymers combines the high EL efficiency of small organometallic complexes with the easy processability of polymers. Referring to FIG. 2, a schematic diagram of the new class of fluorescent complex polymers is depicted, where a pair of organometallic complexes 22 are represented, with the pair being connected to each other by an organic chain spacer 21. In general, each organometallic complex 22 includes a center metal cation and peripheral ligands, having a general structure of $M(L1)_n(L2)_m$, where L1 or L2 can be the same or different ligands; n is the number of ligand L1; m is the number of ligand L2; and it is preferred that n+m be equal to the number of the valence charge of the central metal cation so that the whole organometallic complex 22 is neutral. Organic chain spacer 21 is connected to organometallic complexes 22 by two functional groups, typically being an ester, amide, ether etc.

In this embodiment, two different organometallic complexes 22 containing polymers for use in light emitting devices are disclosed as examples. A first example of an organometallic polymer, Poly-1s, is illustrated below.

Poly-1s

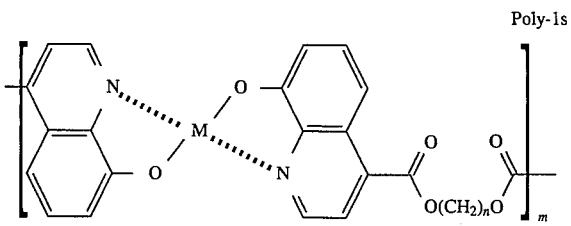

Poly-1s includes a bis(8-quinolinolate)metal complex and a linear polymethylene dicarboxylate ester group, where M is a divalent metal cation such as $Be^{2+}$, $Mg^{2+}$, $Zn^{2+}$ etc.; n=6–12; and m is the number of repeating units in a polymer chain. In the case where n=6 and $M=Zn^{2+}$, the organometallic polymer is synthesized from bis(dimethyl 8-quinolinolate-4-carboxylic ester)zinc complex and hexamethylene-1,6-diol by a condensation reaction. Organometallic polymer films can be obtained by spin-coating the synthesized polymer from polar aprotic solvents such as N,N'-dimethylacetamide, dimthylsulfoxide, 1-methyl-2-pyrolidinone etc.

A second example of an organometallic polymer, Poly-2s, is depicted below.

Poly-2s

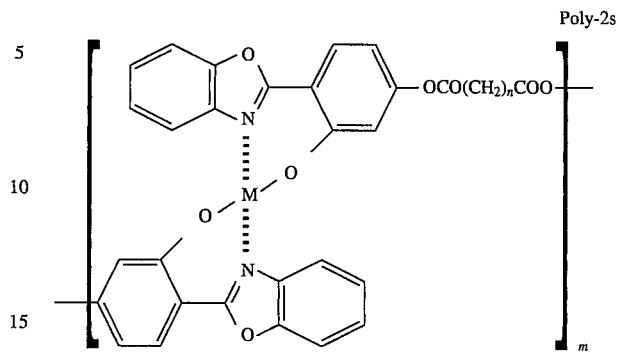

Poly-2s includes a bis(2-(2,4-dioxo-phenyl)benzoxazole) metal complex and a linear polymethylene dicarboxylate ester group, where M is a divalent metal cation such as $Be^{2+}$, $Mg^{2+}$, $Zn^{2+}$ etc; n=6–12; and m is the number of repeating units in a polymer chain. In the case where n=12 and $M=Be^{2+}$, the organometallic polymer is synthesized from bis(2-(2-oxo-4-hydroxyl-phenyl)benzoxazole) beryllium complex and dimethyl dodecamethylene-1,12-dicarboxylate by a condensation reaction. Organometallic polymer films can be obtained by spin-coating the synthesized polymer from polar aprotic solvents such as N,N'-dimethylacetamide, dimthylsulfoxide, 1-methyl-2-pyrolidinone etc.

Since organic chain spacer, or spacers, 21 in the fluorescent complex polymer are relatively small compared to organometallic complexes 22, the fluorescent properties of the fluorescent complex polymer is dominated by organometallic complexes 22. The class of fluorescent complex polymers disclosed herein is comparable in EL efficiency to corresponding small organometallic complexes, but is more stable against aggregation and recrystallization then the corresponding molecular doped polymer system, and has the additional advantages of large-area display capability and low cost manufacturing.

Further, this invention provides a class of new materials, and methods of preparation, for use in light emitting devices with improved reliability. Also, the class of new materials are useful in light emitting devices for large-area display applications which are relatively easy and inexpensive to manufacture.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A fluorescent complex polymer comprising fluorescent organometallic complexes, including a center divalent metal cation and peripheral ligands, connected by organic chain spacers formed of a polymethylene group having an ester, amide, or ether functional group at two ends thereof, the fluorescent organometallic complexes being connected to the functional groups of the organic chain spacers.

2. A fluorescent complex polymer as claimed in claim 1 wherein the a center metal cation and peripheral ligands of the fluorescent organometallic complexes have a general structure $M(L1)_n(L2)_m$, where L1 and L2 are ligands, n is the number of ligand L1, m is the number of ligand L2 and M is the center metal cation.

3. A fluorescent complex polymer as claimed in claim 2 wherein n+m are preferred to be equal to the number of the valence charge of the central metal cation so that the whole organometallic complex is neutral.

4. A fluorescent complex polymer as claimed in claim 2 wherein L1 and L2 are the same ligand.

5. A fluorescent complex polymer as claimed in claim 2 wherein L1 and L2 are different ligands.

6. A fluorescent complex polymer as claimed in claim 1 wherein the fluorescent organometallic complexes connected by organic chain spacers are of the form

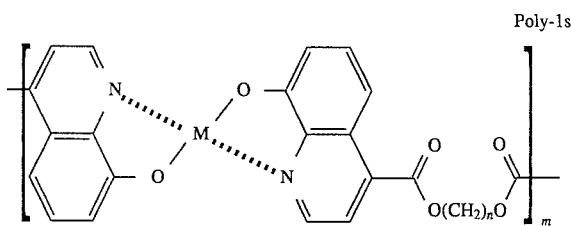

Poly-1s where: M is a divalent metal cation; n is 6–12; and m is the number of repeating units in a polymer chain.

7. A fluorescent complex polymer as claimed in claim 6 wherein the Poly-1s includes a bis(8-quinolinolate) metal complex and a linear polymethylene dicarboxylate ester group.

8. A fluorescent complex polymer as claimed in claim 7 wherein the divalent metal cation is selected from a group comprising $Be^{2+}$, $Mg^{2+}$ and $Zn^{2+}$.

9. A fluorescent complex polymer as claimed in claim 1 wherein the fluorescent organometallic complexes connected by organic chain spacers are of the form

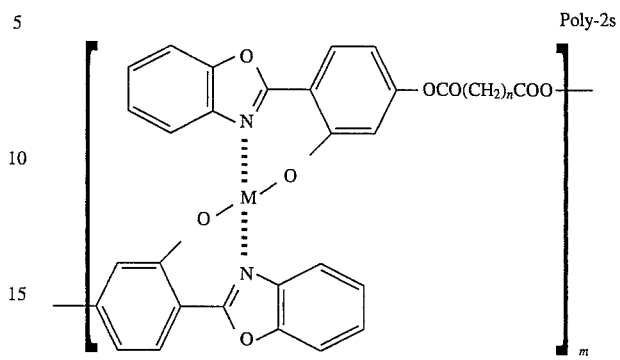

Poly-2s where: M is a divalent metal cation; n is 6–12; and m is the number of repeating units in a polymer chain.

10. A fluorescent complex polymer as claimed in claim 9 wherein the poly-2s includes a bis(2-(2,4-dioxophenyl)benzoxazole) metal complex and a linear polymethylene dicarboxylate ester group.

11. A fluorescent complex polymer as claimed in claim 10 wherein the divalent metal cation is selected from a group comprising $Be^{2+}$, $Mg^{2+}$ and $Zn^{2+}$.

* * * * *